United States Patent
Jin et al.

(10) Patent No.: US 11,171,307 B2
(45) Date of Patent: Nov. 9, 2021

(54) DISPLAY SCREENS AND DISPLAY DEVICES HAVING SUPPORT PILLARS AND BUFFERS

(71) Applicant: YUNGU (GU'AN) TECHNOLOGY CO., LTD., Langfang (CN)

(72) Inventors: Shiyu Jin, Kunshan (CN); Yucheng Liu, Kunshan (CN); Yong Ge, Kunshan (CN); Jiamei Du, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 108 days.

(21) Appl. No.: 16/736,837

(22) Filed: Jan. 8, 2020

(65) Prior Publication Data

US 2020/0144532 A1 May 7, 2020

Related U.S. Application Data

(63) Continuation of application No. PCT/CN2019/084267, filed on Apr. 25, 2019.

(30) Foreign Application Priority Data

Jul. 16, 2018 (CN) .......................... 201810775906.9

(51) Int. Cl.
*H01L 51/52* (2006.01)
*H01L 27/32* (2006.01)
*H01L 51/56* (2006.01)

(52) U.S. Cl.
CPC ........ *H01L 51/525* (2013.01); *H01L 27/3246* (2013.01); *H01L 27/3258* (2013.01);
(Continued)

(58) Field of Classification Search
CPC ... H01L 51/525; H01L 51/5253; H01L 51/56; H01L 27/3246; H01L 27/3258; H01L 2227/323
See application file for complete search history.

(56) References Cited

U.S. PATENT DOCUMENTS 7,564,067 B2 7/2009 Cok
9,419,242 B2 * 8/2016 Baek ..................... H01L 51/525
(Continued)

FOREIGN PATENT DOCUMENTS

CN 101652870 A 2/2010
CN 203259749 U 10/2013
(Continued)

OTHER PUBLICATIONS

CN First Office Action with search report dated May 8, 2019 in the corresponding CN application (application No. 201810775906.9).
(Continued)

*Primary Examiner* — Lex H Malsawma
(74) *Attorney, Agent, or Firm* — Kilpatrick Townsend & Stockton

(57) ABSTRACT

The present disclosure discloses a display screen, which includes an array layer, a planarization layer, a pixel defining layer, a support layer, and a buffer layer. The planarization layer is located on a surface of the array layer. The pixel defining layer is located on a surface of the planarization layer away from the array layer, and the support layer is located on a surface of the pixel defining layer away from the planarization layer. The buffer layer is located on at least one of an end surface of the support layer away from the pixel defining layer and an end surface of the support layer adjacent to the pixel defining layer.

19 Claims, 8 Drawing Sheets

(52) U.S. Cl.
CPC .......... *H01L 51/5253* (2013.01); *H01L 51/56* (2013.01); *H01L 2227/323* (2013.01)

(56) References Cited

U.S. PATENT DOCUMENTS

| | | | | |
|---|---|---|---|---|
| 9,793,508 | B2* | 10/2017 | Wang | ............... H01L 51/5228 |
| 9,978,994 | B2* | 5/2018 | Shen | ............... H01L 27/3211 |
| 10,008,695 | B2 | 6/2018 | Park et al. | |
| 10,121,838 | B2* | 11/2018 | Shim | ............... H01L 27/3251 |
| 10,411,189 | B2* | 9/2019 | Kong | ............... A61K 31/7105 |
| 10,510,970 | B2* | 12/2019 | Lu | ............... H01L 51/5228 |
| 10,566,568 | B2* | 2/2020 | Sun | ............... H01L 27/329 |
| 10,686,022 | B2* | 6/2020 | Lee | ............... H01L 27/3246 |
| 2001/0011868 | A1* | 8/2001 | Fukunaga | ............... H01L 27/1288 313/506 |
| 2010/0097295 | A1* | 4/2010 | Kwak | ............... H01L 51/5284 345/32 |
| 2016/0035803 | A1* | 2/2016 | Kim | ............... H01L 27/326 257/40 |
| 2016/0276619 | A1* | 9/2016 | Cheng | ............... H01L 51/56 |
| 2018/0130970 | A1 | 5/2018 | Wang et al. | |
| 2019/0198818 | A1 | 6/2019 | Huang | |

FOREIGN PATENT DOCUMENTS

| | | |
|---|---|---|
| CN | 204204920 U | 3/2015 |
| CN | 105679774 A | 6/2016 |
| CN | 105957875 A | 9/2016 |
| CN | 106292080 A | 1/2017 |
| CN | 106910841 A | 6/2017 |
| CN | 107067975 A | 8/2017 |
| CN | 108091774 A | 5/2018 |
| CN | 109037470 A | 12/2018 |
| KR | 20070040699 A | 4/2007 |
| TW | 201133950 A | 10/2011 |
| WO | 2017161919 A1 | 9/2017 |

OTHER PUBLICATIONS

CN Second Office Action dated Aug. 8, 2019 in the corresponding CN application (application No. 201810775906.9).

* cited by examiner

DISPLAY SCREENS AND DISPLAY DEVICES HAVING SUPPORT PILLARS AND BUFFERS

CROSS-REFERENCES TO RELATED APPLICATIONS

This application is a continuation application of International Application PCT/CN2019/084267, filed on Apr. 25, 2019, which claims the priority benefit of Chinese Patent Application No. 201810775906.9, titled "DISPLAY SCREENS AND DISPLAY DEVICES" and filed on Jul. 16, 2018. The entireties of these applications are incorporated by reference herein for all purposes.

TECHNICAL FIELD

The present disclosure relates to display technologies.

BACKGROUND

Organic Light-Emitting Diode (OLED) display screen, also known as Organic Electroluminescence Display (OELD) display screen, has the characteristics of lightness, thinness, power saving, high contrast, and the like, and is widely used in display equipment, such as mobile phones, televisions, and the like.

SUMMARY

The present disclosure provides a display screen and a display device having the same.

A display screen includes an array layer, a planarization layer located on a surface of the array layer, a pixel defining layer located on a surface of the planarization layer away from the array layer, a support layer located on a surface of the pixel defining layer away from the planarization layer, and a buffer layer located on at least one of an end surface of the support layer away from the pixel defining layer and an end surface of the support layer adjacent to the pixel defining layer.

In one of the embodiments, the buffer layer includes a plurality of buffers, and the support layer includes a plurality of support groups. Each of the support groups includes a plurality of support pillars, and at least one of an end surface of the support pillar away from the pixel defining layer and an end surface of the support pillar adjacent to the pixel defining layer respectively has one of the buffers provided thereon.

In one of the embodiments, at least one of the end surface of each of the support pillars away from the pixel defining layer and the end surface thereof adjacent to the pixel defining layer is covered by one of the buffers, respectively.

In one of the embodiments, the plurality of buffers are formed alternately on at least one of the end surface of at least one of the support pillars away from the pixel defining layer and the end surface thereof adjacent to the pixel defining layer.

In one of the embodiments, distances between the plurality of buffers are equal to each other. In one of the embodiments, at least a portion of a side surface of at least one of adjacent two support pillars is covered by the buffer.

In one of the embodiments, the support pillar has a shape of rectangular parallelepiped, cube, cylinder, truncated cone, or truncated pyramid.

In one of the embodiments, adjacent two support pillars are connected by one connecting portion in each of the support groups.

In one of the embodiments, a plurality of the connecting portions extend along the same direction. In one of the embodiments, an end surface of the connecting portion away from the pixel defining layer is flush with the end surface of the support pillar away from the pixel defining layer, or an end surface of the connecting portion adjacent to the pixel defining layer is flush with the end surface of the support pillar adjacent to the pixel defining layer.

In one of the embodiments, each of the connecting portions is provided with the buffer on at least one of an end surface thereof away from the pixel defining layer and an end surface thereof adjacent to the pixel defining layer.

In one of the embodiments, the buffer layer is elastic.

In one of the embodiments, the buffer layer is made of organic glue, fibers, or a mixture of organic glue and fibers.

In one of the embodiments, the organic glue is selected from the group consisting of epoxy resin glue, optical glue, and curing glue.

In one of the embodiments, the pixel defining layer is provided with a pixel accommodating cavity configured to accommodate pixels.

In one of the embodiments, the pixel accommodating cavity has a shape of truncated pyramid, cube, or rectangular parallelepiped.

In one of the embodiments, the support layer is provided with a package structure on a side thereof away from the pixel defining layer.

In one of the embodiments, the package structure includes a first inorganic layer, an organic layer, and a second inorganic layer in sequence.

The present disclosure further provides a display device. The display device includes the aforementioned display screen and a housing assembled with the display screen.

DETAILED DESCRIPTION OF THE INVENTION

Figure 1:
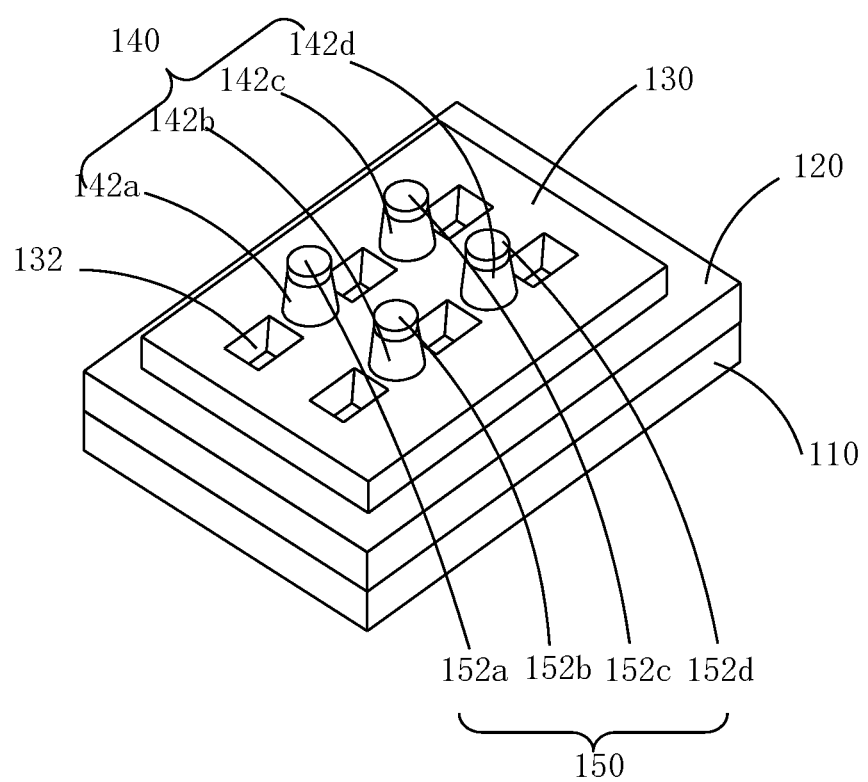
FIG. 1 is a schematic view of a display screen in accordance with an exemplary embodiment of the present disclosure.

The above objects, features, and advantages of the present disclosure will become more apparent by describing in detail embodiments thereof with reference to the accompanying drawings. In the following description, numerous specific details are set forth in order to provide a thorough understanding of the present disclosure. However, the present disclosure can be implemented in many other ways than those described herein, and such modifications may be made by those skilled in the art without departing from the scope of the disclosure, which is therefore not to be limited to the specific embodiments disclosed below.

It should be understood that when an element is referred to as being "fixed to" another element, it can be directly fixed on the other element or intervening elements may be present. When an element is referred to as being "connected" or "coupled" to another element, it can be directly connected or coupled to the other element or intervening elements may be present.

In a production process of a display screen, a reliability ball falling test is required to be carried out to test the strength of a screen body. During the test, a steel ball with a diameter of 20 mm and a weight of 32.65 g is used to impact the screen body. When a falling height ranges from 2 cm to 62.5 cm, the stress of the hit display area of the screen cannot be dispersed, resulting in elements damages, undesirable phenomena such as dark spots, bright spots, colored spots, and the like appear on the display area of the screen.

Referring to FIG. 1 to FIG. 6, the present disclosure provides a display screen 100, which includes an array layer 110, a planarization layer 120 located on a surface of the array layer 110, a pixel defining layer 130 located on a surface of the planarization layer 120 away from the array layer 110, a support layer 140 located on a surface of the pixel defining layer 130 away from the planarization layer 120, and a buffer layer 150 located on an end surface of the support layer 140 away from the pixel defining layer 130 and/or an end surface of the support layer 140 adjacent to the pixel defining layer 130.

In the present disclosure, the array layer 110, the planarization layer 120, and the pixel defining layer 130 are stacked in sequence. When a placement manner and a placement angle of the display screen 100 are changed, the laminating relationship between the layers does not substantially change. In addition, the support layer 140 has two opposite end surfaces and an entire side surface, and the support layer 140 is located on the surface of the pixel defining layer 130 away from the planarization layer 120. The end surface of the support layer 140 adjacent to the pixel defining layer 130 is an end surface of the support layer 140 in contact with the pixel defining layer 130, and the end surface of the support layer 140 away from the pixel defining layer 130 is an end surface of the support layer 140 not in contact with the pixel defining layer 130.

The pixel defining layer 130 is provided with a pixel accommodating cavity 132 for accommodating pixels. The pixel accommodating cavity 132 may have a shape of truncated pyramid, cube, or rectangular parallelepiped, or the like, which is not limited thereto. The pixel defining layer 130 is used to isolate pixels to prevent cross color between adjacent pixels. The pixel defining layer 130 and the pixels are combined to form a light-emitting element layer. In the present embodiment, the pixel is an organic light-emitting diode (OLED). The light-emitting element layer is also provided with a package structure 160 thereon. The package structure 160 is mainly used to isolate the external water and oxygen and prevent internal components from being contaminated and damaged. The package structure 160 generally includes a first inorganic layer 161, an organic layer 162, and a second inorganic layer 163 in sequence. The inorganic layer 161 is usually made of silicon nitride or aluminum oxide, and the organic layer 162 is usually made of acrylate. The support layer 140 is disposed between the pixel defining layer 130 and the package structure 160. The support layer 140 supports the pixel defining layer 130 and the package structure 160, respectively, in different placement manners of the display screen 100. For example, when the package structure 160 is disposed above the pixel defining layer 130, the support layer 140 supports the package structure 160; and when the pixel defining layer 130 is disposed above the package structure 160, the support layer 140 supports the pixel defining layer 130. When the screen body is impacted by an external force, the support layer 140 is easily crushed to cause cracks, fragments, or the like, resulting in phenomena such as dark spots, colored spots, and the like on the screen. Therefore, the buffer layer 150 is disposed on either or both end surfaces of the support layer 140 to reduce the phenomenon that the support layer 140 is crushed, thereby reducing the dark spots, colored spots, and the like on the screen, and improving the overall strength of the display screen 100.

The shape of the support layer 140 is various and is not limited by the embodiments of the present disclosure. In an exemplary embodiment of the present disclosure, the support layer 140 includes a plurality of support pillars 142 that are individually present. The support pillar 142 may have a shape of rectangular parallelepiped, cube, cylinder, truncated cone, truncated pyramid, or the like. In alternative embodiments, the support layer 140 may also include a plurality of support groups. Each of the support groups includes a plurality of support pillars 142. Adjacent two support pillars 142 are connected by one connecting portion 144 in each of the support groups. A projection of the plurality of connection portions 144 on the pixel defining layer 130 is separated from the pixel accommodating cavity 132, and the plurality of connecting portions 144 each extend along the same direction.

The shape of the buffer layer 150 may be designed according to the shape of the support layer 140. For example, when the support layer 140 includes a plurality of individual support pillars 142, and the support pillars 142 have a shape of truncated pyramid, if the buffer layer 150 covers only the end surface of the support pillars 142 away from the pixel defining layer 130, a cross-section of the buffer layer 150 parallel to the end surface has a shape of square or rectangle, and the end of the buffer layer 150 has a three-dimensional pattern of rectangular parallelepiped.

In the aforementioned display screen 100, since the support layer 140 is provided with the buffer layer 150 on the end surface thereof away from the pixel defining layer 130 and/or the end surface thereof adjacent to the pixel defining layer 130, when the screen body is impacted, the buffer layer 150 can buffer a large amount of impact stress to protect the support layer 140. Therefore, the phenomena that dark spots, colored spots, and the like appear on the screen caused by the support layer 140 being crushed can be avoided, thereby improving the overall strength of the display screen 100 and prolonging the service life of the display screen 100.

Figure 2:
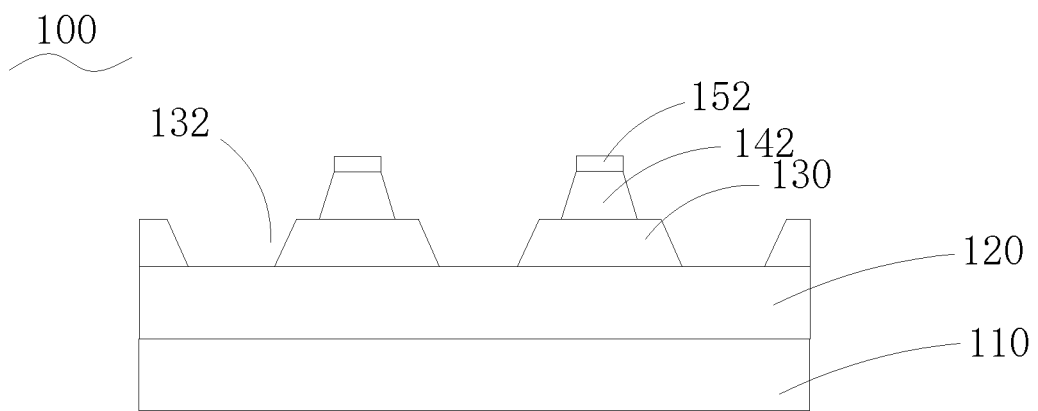
FIG. 2 is a schematic view of a display screen in accordance with an exemplary embodiment of the present disclosure.
Figure 3:
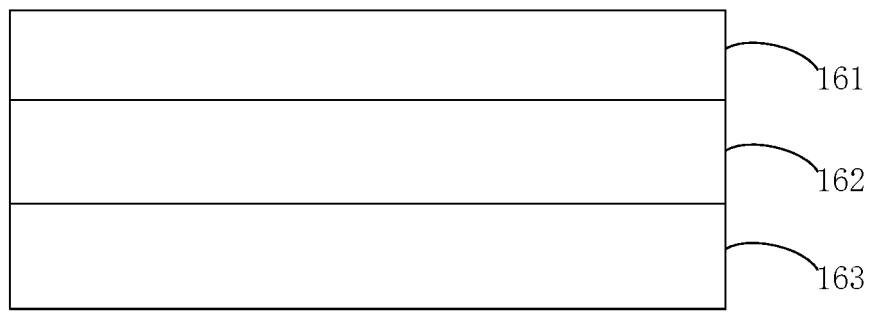
FIG. 3 is a schematic view of a package structure in accordance with an exemplary embodiment of the present disclosure.

In one embodiment, the buffer layer 150 includes a plurality of buffers 152, and the support layer 140 includes a plurality of support pillars 142. Each of the support pillars 142 is provided with the buffer 152 on an end surface thereof away from the pixel defining layer 130 and/or an end surface thereof adjacent to the pixel defining layer 130. The location and number of buffers 152 may be determined based on actual production requirements. The plurality of buffers 152 cooperatively form the buffer layer 150. Referring to FIG. 2, in the present embodiment, each of the support pillars 142 is provided with the buffer 152 on an end surface thereof away from the pixel defining layer 130. The support pillar 142 has a shape of truncated cone. The buffer 152 has a certain thickness, and the buffer 152 has a shape of cylinder. Since the aforementioned buffer layer 150 includes a plurality of buffers 152 disposed on the end surfaces of the support pillar 142, the buffer 152 is capable of buffering a large amount of impact stress when the screen body is impacted, so as to protect the support pillars 142, thereby avoiding phenomena such as dark spots, colored spots, and the like on the screen caused by the support pillar 142 being crushed.

Figure 5:
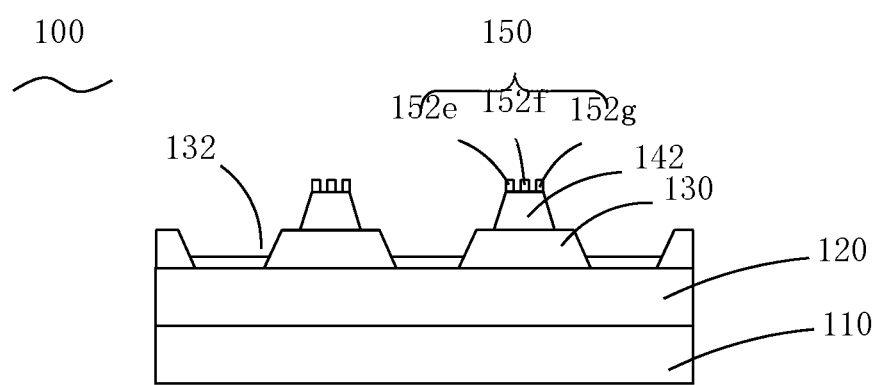
FIG. 5 is a schematic view of a display screen in accordance with still another exemplary embodiment of the present disclosure.
Figure 6:
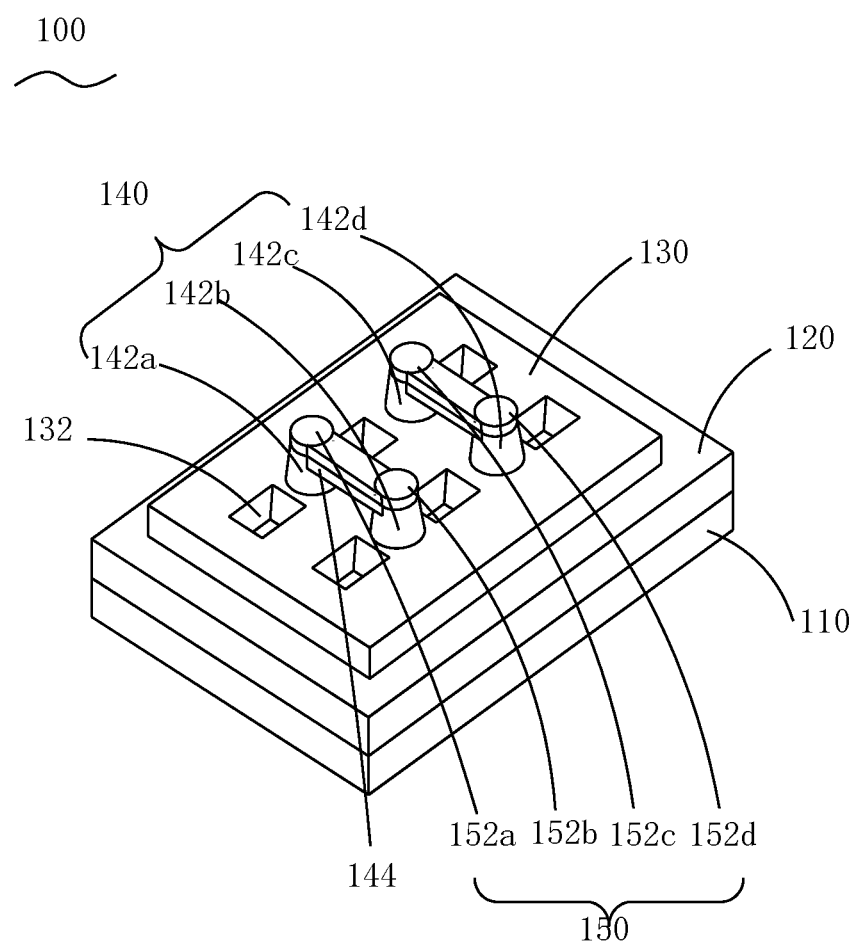
FIG. 6 is a schematic view of a display screen in accordance with another exemplary embodiment of the present disclosure.

In the embodiments of the present disclosure, referring to FIG. 1, FIG. 5, and FIG. 6, the plurality of support pillars 142 are denoted as 142*a*, 142*b*, 142*c*, and 142*d*, respectively; and the plurality of buffers 152 are denoted as 152*a*, 152*b*, 152*c*, 152*d*, 152*e*, 152*f*, and 152*g*, respectively. In alternative figures, the support pillars are denoted by 142 and the buffers are denoted by 152.

In one of the embodiments, the buffer 152 completely covers the end surface of the support pillar 142. In other words, the buffer 152 completely covers the end surface of the support pillar 142 away from the pixel defining layer 130 and/or the end surface thereof adjacent to the pixel defining layer 130, so that the impact stress can be better buffered, thereby protecting the support pillar 142 and preventing the support pillar 142 from being crushed.

Figure 4:
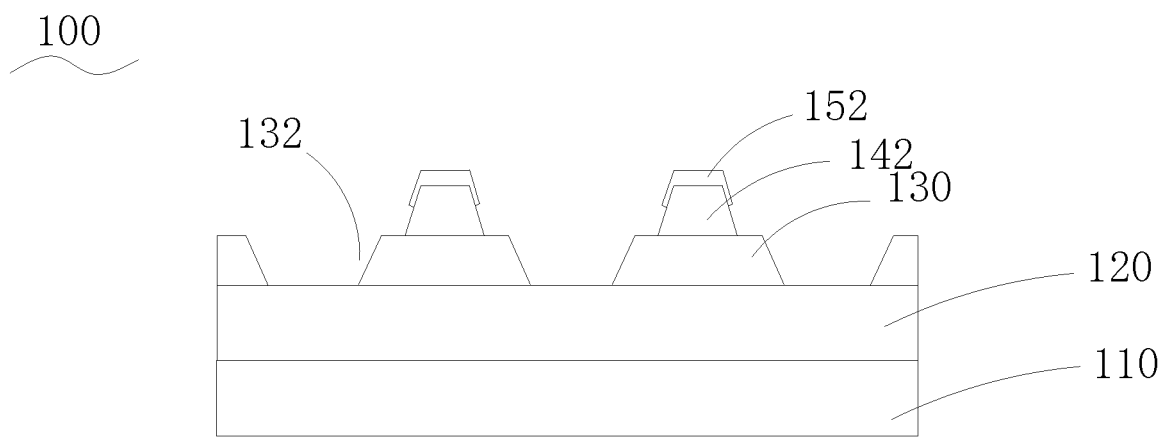
FIG. 4 is a schematic view of a display screen in accordance with another exemplary embodiment of the present disclosure.

Referring to FIG. 4, in one of the embodiments, the buffer 152 covers a portion of a side surface of at least one of the adjacent two support pillars 142 in addition to completely covering the end surface of the support pillar 142 away from the pixel defining layer 130 and/or the end surface thereof adjacent to the pixel defining layer 130, so as to prevent the adjacent support pillars 142 from being impacted by an external force in a direction not perpendicular to the end surfaces of the support pillars 142 in the case where the support pillars 142 are densely arranged. It can be determined whether the side surface of the support pillar 142 is completely covered according to actual production requirements, which is not specifically limited in the present disclosure.

In one of the embodiments, the plurality of buffers 152 are formed alternately on the end surfaces of the support pillars 142. Referring to FIG. 5, the buffers 152*e*, 152*f*, and 152*g* are disposed on the end surfaces at equal intervals. In this way, at the same time of saving raw materials, since there are a plurality of contact portions, the contact points of force are increased, the impact stress is dispersed, and the impact stress can be alleviated, thereby protecting the support pillar 142 and reducing the phenomena such as dark spots, colored spots, and the like on the screen caused by the support pillar 142 being crushed.

In one embodiment, referring to FIG. 6, the buffer layer 150 includes a plurality of buffers 152*a*, 152*b*, 152*c*, and 152*d*. The support layer 140 includes a plurality of support groups. The plurality of support groups are arranged neatly. Each of the support groups includes a plurality of support pillars 142. In each of the support groups, adjacent two support pillars 142 (for example, the support pillars 142*a* and 142*b*, and the support pillars 142*c* and 142*d* in the present embodiment) are connected by one connecting portion 144. The plurality of connecting portions 144 each extend along the same direction, and the projection of the plurality of connecting portions 144 on the pixel defining layer 132 and the pixel accommodating cavity 132 are separated from each other to prevent an influence on the integrity of the pixel structure. Each of the support pillars 142 is provided with one of the buffers 152 on the end surface thereof away from the pixel defining layer 130 and/or the end surface thereof adjacent to the pixel defining layer 130. All of the buffers 152 (including the buffers 152*a*, 152*b*, 152*c*, and 152*d* in the present embodiment) cooperatively form the buffer layer 150. Since the aforementioned support layer 140 includes the plurality of support groups and each of the support groups includes the plurality of support pillars 142 connected in sequence, that is, the plurality of support pillars 142 are not a single independent individual, the adjacent two support pillars 142 are connected to each other, and the support pillars 142 are provided with the buffers 152 on the end surfaces thereof, the support pillar 142 can be protected and the phenomena such as dark spots, colored spots, and the like on the screen caused by the support pillar 142 being crushed can be avoided.

In addition, the buffer 152 covers the end surface of the support pillar 142. In other words, the buffer 152 covers the end surface of the support pillar 142 away from the pixel defining layer 130 and/or the end surface thereof adjacent to the pixel defining layer 130. In one embodiment, an end surface of the connecting portion 144 between the adjacent support pillars 142 away from the pixel defining layer 130 is flush with the end surface of the support pillar 142 away from the pixel defining layer 130, or an end surface of the connecting portion 144 between the adjacent support pillars 142 adjacent to the pixel defining layer 130 is flush with the end surface of the support pillar 142 adjacent to the pixel defining layer 130. The connecting portion 144 between the adjacent support pillars 142 may be provided with the buffer 152 on the end surface thereof away from the pixel defining layer 130 or the end surface thereof adjacent to the pixel defining layer 130, so as to further protect the support group, and avoid phenomena such as dark spots, colored spots, and the like on the screen caused by the support group being crushed.

In one embodiment, the buffer layer 150 is an elastic layer. The elastic material of the elastic layer can well play a role in buffering to prevent the support layer 140 from being crushed and to perform effective impact protection.

In addition, the elastic layer is made of organic glue such as epoxy resin glue, OCA (Optically Clear Adhesive) optical glue, curing glue, and the like, and/or fibers, and/or a mixture of organic glue and fibers. Organic glue and fiber are relatively common in life and production, the cost is relatively low, and the process flow is also relatively simple. There are many types of elastic materials, which are not limited to the embodiments of the present disclosure, and other elastic materials that can be applied to the interior of the screen body are also applicable to the present disclosure.

Figure 8:
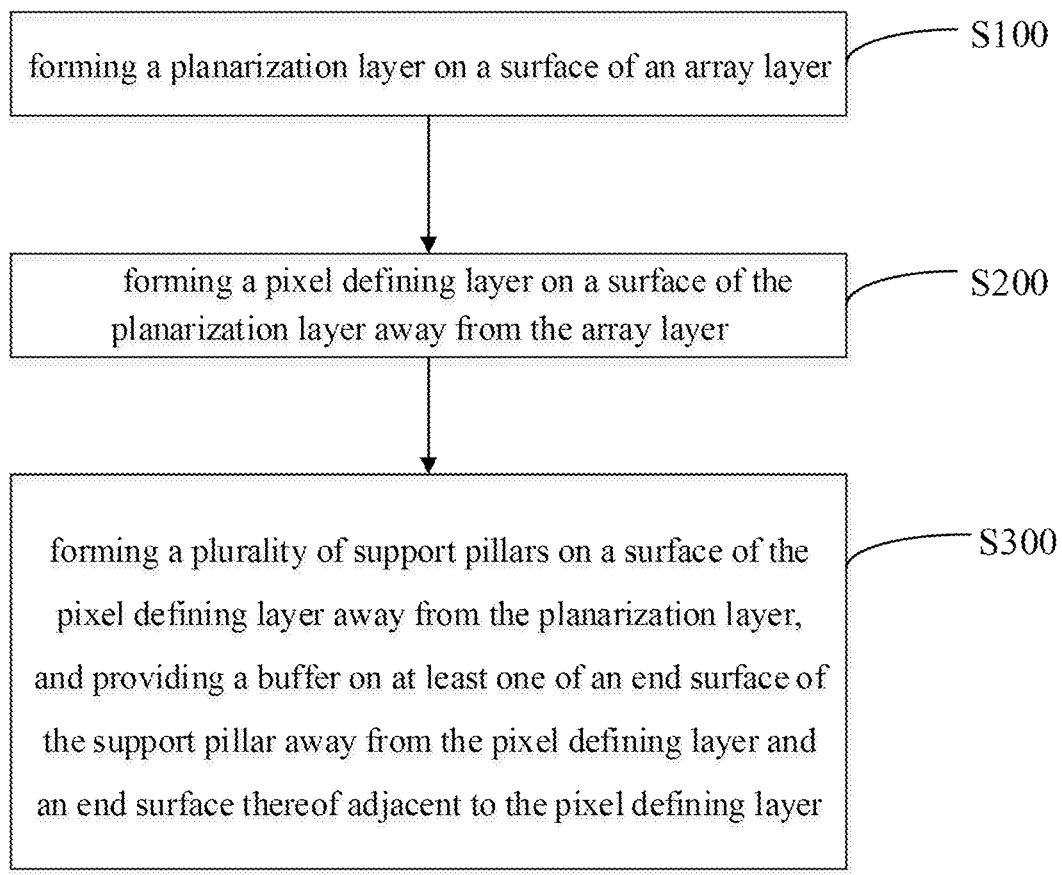
FIG. 8 is a flow chart of a method of manufacturing a display screen in accordance with an exemplary embodiment of the present disclosure.

A method of manufacturing the display screen 100 of the present disclosure is described below with reference to FIG. 8, taking as an example that the support layer 140 includes a plurality of individual support pillars 142, and the buffer layer 150 is disposed on the end surface away from the pixel defining layer 130, and includes the following steps:

At step S100, a planarization layer is formed on a surface of an array layer.

The array layer 110 includes a flexible substrate layer, a semiconductor layer, a gate insulating layer disposed on the semiconductor layer, a gate located on the gate insulating layer, an interlayer insulating layer disposed on the gate, and a source and a drain located on the interlayer insulating layer and electrically coupled to a source area and a drain area through contact holes. The planarization layer 120 is disposed on the source and the drain, and the planarization layer 120 is provided with a contact hole extending to the drain. The planarization layer 120 makes the film layer more planar.

At step S200, a pixel defining layer is formed on a surface of the planarization layer away from the array layer.

The planarization layer 120 is provided with the pixel defining layer 130 on the surface thereof, and the pixel defining layer 130 is used to isolate pixels and prevent cross color between adjacent pixels. The pixel defining layer 130 may be made of a positive photoresist material such as polyimide, epoxy resin, phenolic resin, polyamide resin, or the like by photolithography or printing.

At step S300, a plurality of support pillars are formed on a surface of the pixel defining layer away from the planarization layer, and a buffer is provided on an end surface of the support pillar away from the pixel defining layer.

The plurality of support pillars 142 are formed on the surface of the pixel defining layer 130, and the support pillar 142 may have a shape of rectangular parallelepiped, cube, cylinder, truncated cone, truncated pyramid, or the like. The support pillar 142 is further provided with a package structure 160 on a side thereof away from the pixel defining layer 130, and the support pillar 142 serves as a support for the package structure 160. The support pillar 142 is provided with the buffer 152 on the end surface thereof away from the pixel defining layer 130. When the screen body is impacted, the buffer layer 150 can buffer a large amount of impact stress to protect the support layer 140, thereby avoiding phenomena such as dark spots, colored spots, and the like on the screen caused by the support layer 140 being crushed, and further improving the overall strength of the display screen 100 and prolonging the service life of the display screen 100.

In one embodiment, the step of providing the buffer 152 on the end surface of the support pillar 142 away from the pixel defining layer 130 specifically includes: the organic glue is spin-coated on the end surface of the support pillar 142 away from the pixel defining layer 130, and the organic glue is cured to form a screen body with a buffer 152 composed of the organic glue.

In the present embodiment, the buffer 152 is made of organic glue. Specifically, taking the buffer 152 as epoxy resin as an example, the step of providing the buffer 152 on the end surface of the support pillar 142 away from the pixel defining layer 130 will be described.

First, the epoxy resin A glue and the epoxy resin B glue are mixed in a ratio of 3:1 and uniformly stirred, and the uniformly stirred mixed colloid is spin-coated to the end surface of the support pillar 142. Then, the screen body is placed into a drying oven at a temperature of 80° C. for curing, the curing is performed for about 2 hours, and the curing time can be determined according to the curing state of the specific colloid. Finally, the cured screen body is taken out from the drying oven, and a screen body with the buffer 152 on the end surface of the support pillar 142 is obtained.

In one embodiment, when the buffer 152 is made of fibers, the step of providing the buffer 152 on the end surface of the support pillar 142 away from the pixel defining layer 130 specifically includes: the fibers are attached to the end surfaces of the support pillar 142 to form a screen body with a buffer 152 composed of the fibers. Specifically, the fibers are bonded to the end surface of the support pillar 142 away from the pixel defining layer 130 by the organic glue, resulting in a screen body having the buffer 152 on the end surface of the support pillar 142 away from the pixel defining layer 130. Alternatively, the fibers and the organic glue are mixed uniformly, and spin-coated on the end surface of the support pillar 142 away from the pixel defining layer 130, and the mixture is cured to obtain a screen body having the buffer 152 on the end surface of the support pillar 142 away from the pixel defining layer 130.

In the aforementioned two embodiments, when the buffer 152 made of different materials is disposed on the support pillar 142, the corresponding method steps are different. The organic glue and the fibers have good elasticity, strong buffering effect, and simpler process.

In step 300, the support pillar 142 may also be provided with the buffer on the end surface thereof away from the pixel defining layer 130 and/or the end surface thereof adjacent to the pixel defining layer 130. The specific setting process of the buffer may refer to the foregoing setting process, and the specific step sequence can be adjusted as required.

In the method of manufacturing the display screen 100 provided in the present disclosure, the support layer 140 is provided with the buffer layer 150 on the end surface thereof away from the pixel defining layer 130 and/or the end surface thereof adjacent to the pixel defining layer 130. When the screen body of the display screen 100 is impacted, the buffer layer 150 can buffer a large amount of impact stress to protect the support layer 140, so that the phenomena such as dark spots, colored spots, and the like on the screen caused by the support layer 140 being crushed is avoided, thereby improving the overall strength of the display screen 100 and prolonging the service life of the display screen 100.

The present disclosure further provides a display device 200.

Figure 7:
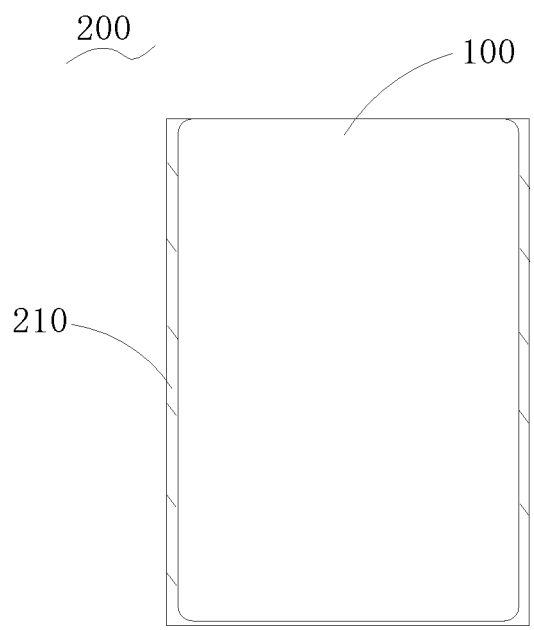
FIG. 7 is a schematic view of a display device in accordance with an exemplary embodiment of the present disclosure.

Referring to FIG. 7, the display device 200 provided by the present disclosure includes the display screen 100 in any of the aforementioned embodiments.

Specifically, the display device 200 further includes a housing 210 assembled with the display screen 100. A layer of protective glass is also disposed over a polarizer of the display screen 100. The display screen 100 is wrapped inside the housing 210, and the surface of the display screen 100 is exposed to the external environment. The housing 210 may enclose the contour edge of the display screen 100 such that the edge of the housing 210 is flush with the surface of the display screen 100. Alternatively, the housing 210 may enclose the contour edge of the display screen 100 and extend to cover the surface of the display screen 100 having a smaller size. It can be understood that the contour edge of the display screen 100 enclosed by the housing 210 is not limited to the entire contour, and may be a partial contour such as a symmetrical two-sided contour to protect the display screen 100.

The aforementioned display device 100 includes the display screen 100 in any of the aforementioned embodiments, in the display screen 100, the support layer 140 is provided with the buffer layer 150 on the end surface thereof away from the pixel defining layer 130 and/or the end surface thereof adjacent to the pixel defining layer 130. When the screen body is impacted, the buffer layer 150 can buffer a large amount of impact stress to protect the support layer 140, so that the phenomena such as dark spots, colored spots, and the like on the screen caused by the support layer 140 being crushed is avoided, thereby improving the overall strength of the display screen 100 and prolonging the service life of the display screen 100.

Although the respective exemplary embodiments have been described one by one, it shall be appreciated that the respective exemplary embodiments will not be isolated. Those skilled in the art can apparently appreciate upon reading the disclosure of this application that the respective technical features involved in the respective exemplary embodiments can be combined arbitrarily between the respective exemplary embodiments as long as they have no collision with each other. Of course, the respective technical features mentioned in the same exemplary embodiment can also be combined arbitrarily as long as they have no collision with each other.

The foregoing descriptions are merely specific exemplary embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure. Therefore, the protection scope of the present disclosure shall be subject to the protection scope of the appended claims.

The invention claimed is:

1. A display screen, comprising:
   an array layer;
   a planarization layer overlaying a surface of the array layer;
   a pixel defining layer positioned on a surface of the planarization layer away from the array layer;
   a support layer positioned on a surface of the pixel defining layer away from the planarization layer; and
   a buffer layer positioned on at least one of an end surface of the support layer away from the pixel defining layer and an end surface of the support layer adjacent to the pixel defining layer; wherein the buffer layer is elastic.

2. The display screen according to claim 1, wherein the buffer layer comprises a plurality of buffers, the support layer comprises a plurality of support groups, each of the support groups comprises a plurality of support pillars, and at least one of an end surface of the support pillar away from the pixel defining layer and an end surface of the support pillar adjacent to the pixel defining layer respectively has one of the buffers provided thereon.

3. The display screen according to claim 2, wherein at least one of the end surface of each of the support pillars away from the pixel defining layer and the end surface thereof adjacent to the pixel defining layer is covered by one of the buffers, respectively.

4. The display screen according to claim 2, wherein the plurality of buffers are formed on at least one of the end surfaces of at least one of the support pillars away from the pixel defining layer and the end surface thereof adjacent to the pixel defining layer.

5. The display screen according to claim 4, wherein distances between the plurality of buffers are equal to each other.

6. The display screen according to claim 2, wherein at least a portion of a side surface of at least one of adjacent two support pillars is covered by the buffer.

7. The display screen according to claim 2, wherein the support pillar has a shape of rectangular parallelepiped, cube, cylinder, truncated cone, or truncated pyramid.

8. The display screen according to claim 2, wherein adjacent two support pillars are connected by one connecting portion in each of the support groups.

9. The display screen according to claim 8, wherein a plurality of the connecting portions extend along the same direction.

10. The display screen according to claim 8, wherein an end surface of the connecting portion away from the pixel defining layer is flush with the end surface of the support pillar away from the pixel defining layer, or an end surface of the connecting portion adjacent to the pixel defining layer is flush with the end surface of the support pillar adjacent to the pixel defining layer.

11. The display screen according to claim 10, wherein each of the connecting portions is provided with the buffer on at least one of an end surface thereof away from the pixel defining layer and an end surface thereof adjacent to the pixel defining layer.

12. The display screen according to claim 1, wherein the buffer layer is made of organic glue, fibers, or a mixture of organic glue and fibers.

13. The display screen according to claim 1, wherein the organic glue is selected from epoxy resin glue, optical glue, and curing glue.

14. The display screen according to claim 1, wherein the pixel defining layer is provided with a pixel accommodating cavity configured to accommodate pixels.

15. The display screen according to claim 14, wherein the pixel accommodating cavity has a shape of truncated pyramid, cube, or rectangular parallelepiped.

16. The display screen according to claim 1, wherein the support layer is provided with a package structure on a side of the support layer away from the pixel defining layer.

17. The display screen according to claim 1, wherein the package structure comprises a first inorganic layer, an organic layer, and a second inorganic layer in sequence.

18. A display device, comprising:
   a display screen of claim 1; and
   a housing assembled with the display screen.

19. A display screen, comprising:
   an array layer;
   a planarization layer overlaying a surface of the array layer;
   a pixel defining layer positioned on a surface of the planarization layer away from the array layer;
   a support layer positioned on a surface of the pixel defining layer away from the planarization layer; and
   a buffer layer positioned on at least one of an end surface of the support layer away from the pixel defining layer and an end surface of the support layer adjacent to the pixel defining layer;
   wherein the buffer layer comprises a plurality of buffers, the support layer comprises a plurality of support groups, each of the support groups comprises a plurality of support pillars;
   wherein adjacent two support pillars are connected by one connecting portion in each of the support groups; and
   wherein an end surface of the connecting portion away from the pixel defining layer is flush with an end surface of the support pillar away from the pixel defining layer, or an end surface of the connecting portion adjacent to the pixel defining layer is flush with an end surface of the support pillar adjacent to the pixel defining layer.

* * * * *